US006197634B1

(12) United States Patent
Schuegraf

(10) Patent No.: US 6,197,634 B1
(45) Date of Patent: *Mar. 6, 2001

(54) RUGGED METAL ELECTRODES FOR METAL-INSULATOR-METAL CAPACITORS

(75) Inventor: Klaus F. Schuegraf, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,156

(22) Filed: Sep. 25, 1998

Related U.S. Application Data

(62) Division of application No. 08/943,222, filed on Oct. 6, 1997, now Pat. No. 6,015,986, which is a continuation of application No. 08/576,952, filed on Dec. 22, 1995, now abandoned.

(51) Int. Cl.⁷ .................................................. H01L 21/336
(52) U.S. Cl. ......................... 438/255; 438/398; 438/964; 438/933
(58) Field of Search ..................................... 438/683, 255, 438/592, 398, 649, 964, 630, 655, 682, 648, 919, 60; 257/764, 751, 763, 767, 303, 298, 304, 309, 310

(56) References Cited

U.S. PATENT DOCUMENTS 5,043,780   8/1991   Fazan et al. .
5,102,832   4/1992   Tuttle .

(List continued on next page.)

FOREIGN PATENT DOCUMENTS 403436361   6/1991   (JP) ..................................... 257/306

OTHER PUBLICATIONS

Watanabe et al., "Hemispherical Grained Si Formation on in—situ Phosphorus Doped Amorphous–Si Electrode for 256Mb DRAM's Capacitor", IEEE Transactions on Electron Devices, vol. 42, No. 7, pp. 1247–1253, Jul. 1995.

Watanabe et al., "An Advanced technique for Fabricating Hemispherical–Grained (HSG) Silicon Storage Electrodes", IEEE Transactions on Electron Devices, vol. 42, No. 2, pp. 295–300, Feb. 1995.

Sakai et al., "Novel Seeding Method for the Growth of Polycrystalline Si Films with Hemispherical Grains", Applied Physics Letters, vol. 6, No. 2, pp. 159–161, Jul. 13, 1992.

Kago et al., "A $0.29\mu m^2$ MIM CROWN Cell and Process Technologies for 1–Gigabit DRAM's", IEDM, 1194, pp. 927–929.

Primary Examiner—Charles Bowers
Assistant Examiner—Laura M Schillinger
(74) Attorney, Agent, or Firm—Knobbe, Martens, Olson & Bear LLP

(57) ABSTRACT

Thin film metal-insulator-metal capacitors having enhanced surface area are formed by a substituting metal for silicon in a preformed electrode geometry. The resulting metal structures are advantageous for high-density DRAM applications since they have good conductivity, enhanced surface area and are compatible with capacitor dielectric materials having high dielectric constant.

17 Claims, 4 Drawing Sheets

U.S. PATENT DOCUMENTS

| | | | |
|---|---|---|---|
| 5,110,752 | 5/1992 | Lu . | |
| 5,112,773 | 5/1992 | Tuttle . | |
| 5,130,885 | 7/1992 | Fazan et al. . | |
| 5,138,411 | 8/1992 | Sandhu . | |
| 5,182,232 | 1/1993 | Chhabra . | |
| 5,191,509 | 3/1993 | Wen . | |
| 5,245,206 * | 9/1993 | Chu et al. | 257/309 |
| 5,318,920 | 6/1994 | Hayashide . | |
| 5,320,880 | 6/1994 | Sandhu et al. . | |
| 5,340,765 | 8/1994 | Dennison et al. . | |
| 5,366,917 * | 11/1994 | Watanabe et al. | 437/47 |
| 5,366,919 | 11/1994 | Tanaka et al. . | |
| 5,372,962 | 12/1994 | Hirota et al. . | |
| 5,384,152 * | 1/1995 | Chu et al. | 427/81 |
| 5,385,863 | 1/1995 | Tatsumi et al. . | |
| 5,407,534 | 4/1995 | Thakur . | |
| 5,413,950 * | 5/1995 | Chen et al. | 437/52 |
| 5,418,180 | 5/1995 | Brown . | |
| 5,474,949 | 12/1995 | Hirao . | |
| 5,486,488 | 1/1996 | Kamiyama . | |
| 5,561,307 | 10/1996 | Mihara et al. . | |
| 5,563,090 * | 10/1996 | Lee et al. | 437/60 |
| 5,569,614 | 10/1996 | Kataoka et al. . | |
| 5,587,614 * | 12/1996 | Hwang et al. | 257/532 |
| 5,608,247 | 3/1997 | Brown . | |
| 5,770,500 * | 6/1998 | Batra et al. | 438/255 |
| 5,801,104 * | 9/1998 | Shuegraf et al. | 438/778 |
| 5,856,237 * | 1/1999 | Ku | 438/683 |
| 5,861,675 * | 1/1999 | Sasaki et al. | 257/764 |
| 6,015,986 * | 1/2000 | Schuegraf | 257/303 |
| 6,060,355 * | 5/2000 | Batra et al. | 438/255 |
| 6,105,986 * | 1/2000 | Shuegraf | 257/303 |
| 6,107,227 * | 4/2000 | Jacquin et al. | 501/138 |

* cited by examiner

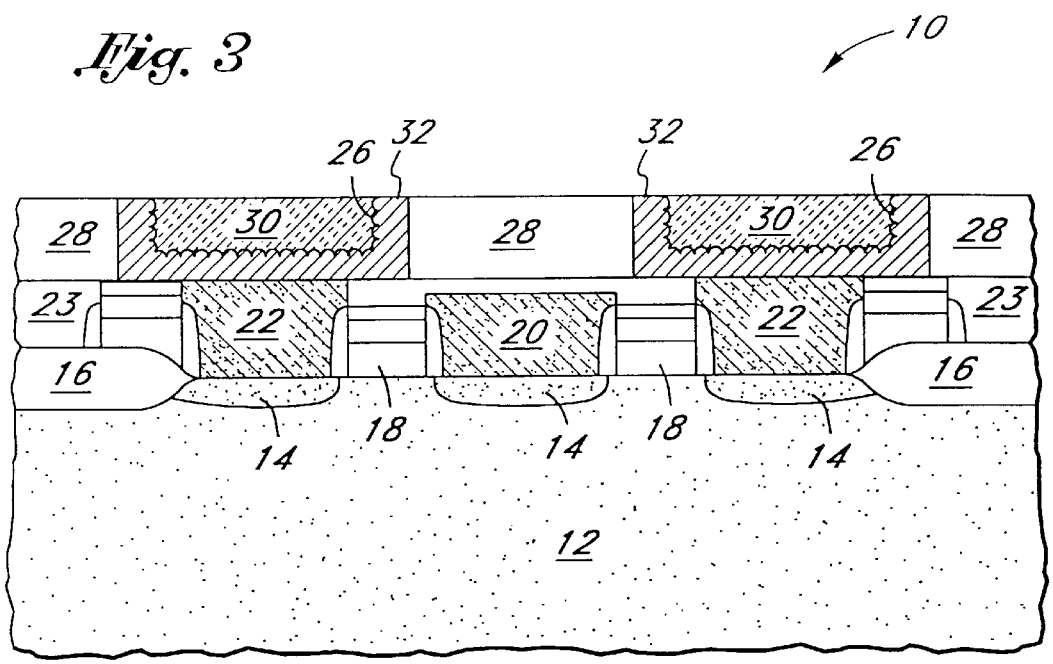
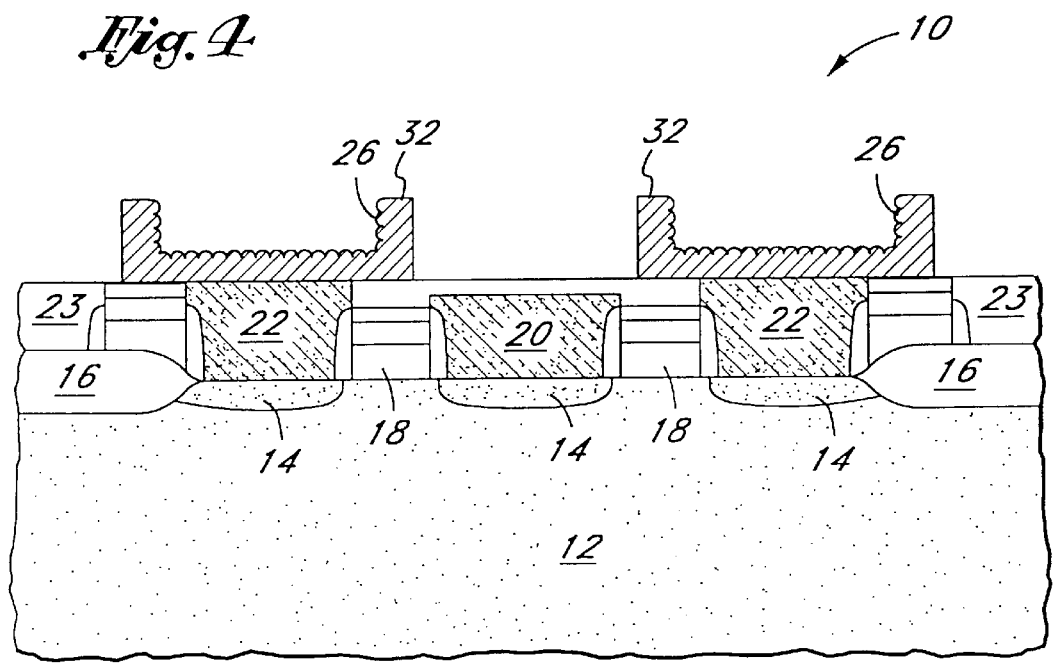

RUGGED METAL ELECTRODES FOR METAL-INSULATOR-METAL CAPACITORS

This application is a division of U.S. application Ser. No. 08/943,222, filed Oct. 6, 1997 now U.S. Pat. No. 6,015,986, which is a file wrapper continuation of U.S. application Ser. No. 08/576,952, filed Dec. 22, 1995 now abandoned.

FIELD OF THE INVENTION

The invention relates generally to thin film integrated circuit design and fabrication. In particular, the invention pertains to electrode design and materials used in stacked cell capacitor Dynamic Random Access Memories (DRAM).

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance, $C=\epsilon A/d$, where $\epsilon$ is the dielectric constant of the capacitor dielectric, A is the electrode (or storage node) area and d is the interelectrode spacing. The conditions of DRAM operation such as operating voltage, leakage rate and refresh rate, will in general mandate that a certain minimum charge be stored by the capacitor.

In the continuing trend to higher memory capacity, the packing density of storage cells must increase, yet each will maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area. Several techniques have been developed to increase the total charge capacity of the cell capacitor without significantly affecting the cell area. These include new structures utilizing trench and stacked capacitors, electrodes having textured surface morphology and new capacitor dielectric materials having higher dielectric constants.

Recently, for example, a great deal of attention has been given to the development of thin film dielectric materials that possess a dielectric constant significantly greater (>10x) than the conventional dielectrics used today, such as silicon oxides or nitrides. Particular attention has been paid to Barium Strontium Titanate (BST), Barium Titanate (BT), Lead Zirconate Titanate (PZT), Tantalum Pentoxide ($Ta_2O_5$) and other high dielectric constant materials as a cell dielectric material of choice for DRAMs. These materials, in particular BST, have a high dielectric constant (>300) and low leakage currents which makes them very attractive for high density memory devices. Due to their reactivity and complex processing, these dielectric materials are generally not compatible with the usual polysilicon electrodes. Thus, much effort has been directed to developing suitable metal electrodes for use with such dielectric materials.

As DRAM density has increased (1 MEG and beyond), thin film capacitors, such as stacked capacitors (STC), trenched capacitors, or combinations thereof, have evolved in attempts to meet minimum space requirements. Many of these designs have become elaborate and difficult to fabricate consistently as well as efficiently. Furthermore, the recent generations of DRAMs (4 MEG, 16 MEG for example) have pushed conventional thin film capacitor technology to the limit of processing capability. In giga-scale STC DRAMs the electrode conductivity plays an important role in device size and performance; thus, two kinds of capacitors have been considered, the three-dimensional metal electrode such as the FIN or CROWN, or the simple metal electrode with higher-permitivity dielectric films. For example, a recent article by T. Kaga et al. ("0.29 $\mu m^2$ MIM-CROWN Cell and Process Technologies for 1-Gigabit DRAMs," T. Kaga et al., IEDM '94, pp. 927–929.) discloses a substituted tungsten process for forming three-dimensional metal electrodes from polysilicon "molds." The article, herein incorporated by reference, discloses a method advantageous for creating metal structures, such as capacitor electrodes; nevertheless the simple structures created thus far are not sufficient to meet the demands of giga-scale DRAM arrays.

SUMMARY OF THE INVENTION

It is an object of the present invention to provide a metal structure having a textured surface morphology. It is another object of the present invention to provide processes by which textured metal structures are fabricated, such processes being compatible with silicon integration technology. It is furthermore an object of the present invention to provide a metal-insulator-metal DRAM capacitor having textured electrodes advantageous for gigabit-scale memory arrays.

In accordance with one aspect of the present invention a method of forming a textured metal structure comprises first forming a predetermined textured silicon structure having the desired form, and then replacing silicon atoms in the textured structure with metal atoms. A method of forming a predetermined textured structure preferably comprises depositing an amorphous or polycrystalline silicon structure by chemical vapor deposition, and then exposing the structure to a controlled annealing process to form a silicon surface having a textured surface morphology. The metal substitution process preferably comprises exposing the textured structure to a refractory metal-halide complex, and most preferably to $WF_6$.

In accordance with another aspect of the present invention, a process for fabricating a metal-insulator-metal capacitor on a semiconductor wafer comprises first forming a silicon electrode structure on the semiconductor wafer, texturizing the silicon electrode structure, and then replacing the silicon in the silicon electrode structure with a metal, thereby forming a textured metal electrode. The process further comprises depositing a dielectric layer having a high dielectric constant over the textured metal electrode followed by a metal layer deposited over the dielectric layer. Replacing the silicon in the silicon electrode structure preferably comprises exposing the silicon electrode structure to a refractory metal-halide complex, such as $WF_6$. The dielectric layer preferably comprises a material selected from the group consisting of $Ta_2O_5$, $BaTiO_3$, $SrTiO_3$, $Ba_xSr_{1-x}TiO_3$, and $PbZr_xTi_{1-x}O_3$, and the metal layer preferably comprises titanium.

In accordance with yet another aspect of the present invention a DRAM capacitor comprises a metal electrode having a textured surface morphology overlayed by a dielectric material having a high dielectric constant and covered by a metal layer. The metal electrode of the DRAM capacitor is preferably comprised of a refractory metal, such as tungsten. The dielectric material of the DRAM capacitor is preferably, comprised of a material selected from the group consisting of $Ta_2O_5$, $BaTiO_3$, $SrTiO_3$, $Ba_xSr_{1-x}TiO_3$, and $PbZr_xTi_{1-x}O_3$. Furthermore, the top electrode layer of the DRAM capacitor preferably comprises a refractory metal, such as titanium.

These and other objects and attributes of the present invention will become more fully apparent with the following detailed description and accompanying figures.

BRIEF DESCRIPTION OF THE DRAWINGS

FIG. 3 is a schematic section of a preferred DRAM electrode after a metal substitution process.

FIG. 4 is a schematic section of a preferred DRAM electrode after oxide removal.

DETAILED DESCRIPTION OF THE INVENTION

In accordance with the principles of the present invention, complex metal structures having enhanced surface area advantageous for DRAM storage capacitors are fabricated by first forming rugged or texturized polysilicon ("poly") electrodes and subsequently subjecting the poly structures to a metal-substitution process. The rugged metal electrodes are advantageous for high-density DRAM storage applications because they exhibit a substantially higher conductivity than conventional doped poly electrodes and they are compatible with high-$\epsilon$ dielectric materials such as $Ta_2O_5$, BST, PZT and others. The preferred embodiment of the present invention is directed to a novel DRAM storage cell having a rugged metal electrode. The inventive aspects are herein disclosed in connection with a preferred process for fabricating rugged metal electrodes in accordance with the aforementioned principles, beginning with the formation of the cell capacitor itself.

Figure 1:
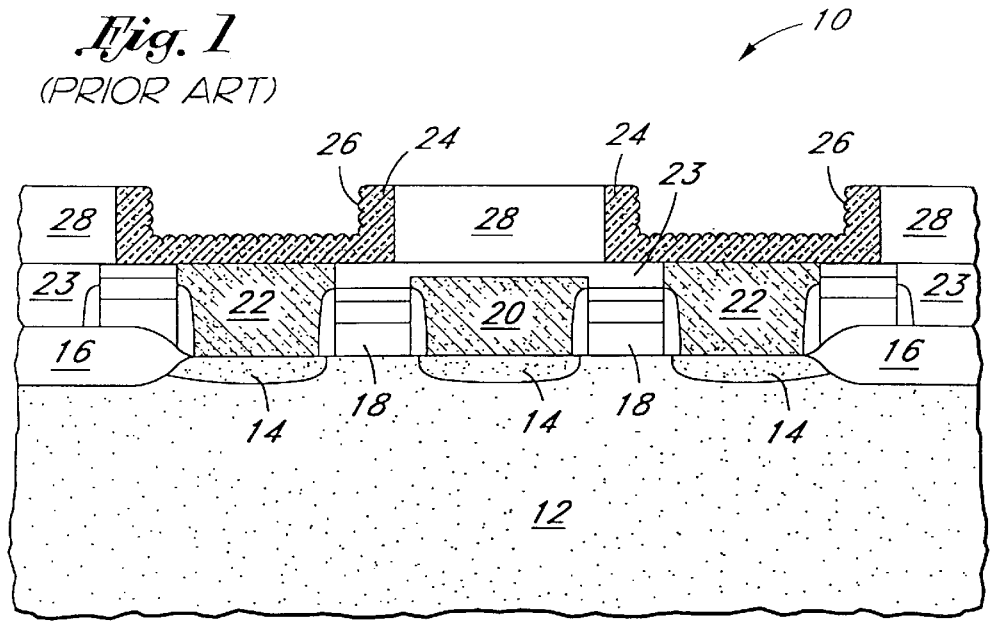
FIG. 1 is a schematic section of an exemplary DRAM structure having textured electrodes.

Referring to FIG. 1, a conventional front-end DRAM cell formation comprises a semiconductor substrate 12 processed to a point where capacitor fabrication begins. At this stage in the fabrication process, the DRAM cell may have field oxide regions 16, active regions 14, word lines 18, bit lines 20, capacitor plugs 22, and planarizing layer 23. The capacitor structures of the present invention begins with the formation of polysilicon electrodes 24 having a textured or rugged surface region 26. The textured surface 26 increases the electrode surface area without increasing the lateral dimensions of the electrode 24.

Polysilicon or amorphous silicon (a-Si) are preferred materials from which to fabricate the electrode structure 24 and rugged surface 26. The subsequent metal substitution reaction (to be described) is shown to be effective in faithfully replicating the silicon structure by the substituted metal. Moreover, such reactions are compatable with other silicon fabrication processes and thus are capable of producing complex structures with high dimensional tolerances in a cost-effective manner. For example, the silicon electrodes 24 may be formed by depositing a layer of polysilicon or a-Si over the poly plugs 22 and adjacent oxide spacers 28 by well-known chemical vapor deposition processes. A subsequent planarizing process such as a chemical-mechanical polish or anisotropic etch may remove the topmost portion of the layer, yielding the isolated electrode structures 24. The rugged surface 26 may be fabricated by a seeding and anneal process which produces a rough surface morphology comprising relatively large polycrystalline silicon grains of about 50–200 nm. Such processes for example are disclosed in U.S. Pat. No. 5,102,832 by M. E. Tuttle, herein incorporated by reference. A seeding process may for example comprise dispersing a material such as polysilicon or silicon dioxide over the surface which produces nucleation sites on the surface of the silicon electrodes 24. A controlled anneal process then induces accumulation of silicon at the nucleation sites, thereby forming a rough surface morphology having enhanced surface area. The resulting surface morphology, often appearing bulbous, is usually comprised of relatively large polycrystallites, referred to as Hemispherically Grained Silicon (HSG). An exemplary method for forming HSG on complex stacked capacitor structures is disclosed in U.S. Pat. No. 5,340,765 by C. H. Dennison et al., also herein incorporated by reference. It will be appreciated that the processes heretofore disclosed are sufficient to produce a starting electrode structure 24 having a rugged surface 26 in accordance with the present invention. However, the processes themselves are disclosed by way of example, and it will also be appreciated that other processes may be utilized to achieve a similar result.

Figure 2:
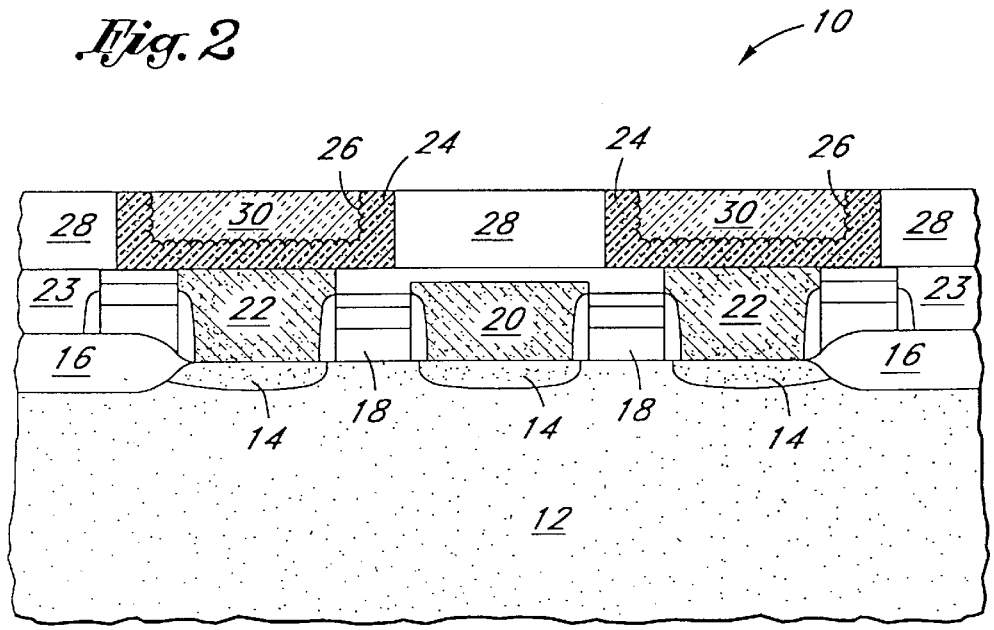
FIG. 2 is a schematic section of the DRAM structure shown in FIG. 1 illustrating a completed oxide "mold."

Beginning with the complex electrode structure shown in FIG. 1, and referring now to FIG. 2, a next step in accordance with the present embodiment comprises depositing a silicon dioxide ("oxide") layer over the entire structure and planarizing to produce the filled oxide regions 30. The oxide layer 28 and filled oxide regions 30 thus form a boundary or "mold" between which the metal substitution process shall proceed.

The next step in the present embodiment is to convert the silicon electrode structure 24 with ruggedized surface 26 to a metal electrode by the general process:

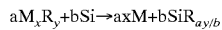

where $M_xR_y$ is a refractory metal-halide complex such as $WF_6$, and a, b are appropriate numerical constants. It is anticipated that a variety of refractory metal complexes may be used for the substitution, such as complexes of tungsten, molybdenum, and titanium. For example, the silicon comprising the electrode structures 10, may be converted to tungsten (W) by the process:

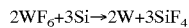

yielding electrodes 32 having rugged surfaces 26 comprised of substantially tungsten metal, as shown in FIG. 3. The process may be carried out in situ by exposing the wafer to the volatile W complex. The time required for a substitution will in general depend upon other parameters such as the wafer temperature, W-complex partial pressure and volume of material to be substituted. For the general size of structures considered here, the metal substitution may require 10 or several tens of minutes. The process may be accelerated by a chemical-oxide pretreatment, for example comprising exposing the silicon electrode structures 10 to a mixture of ammonia ($NH_3$) and hydrogen peroxide ($H_2O_2$) prior to the metal substitution process. The chemical oxide is shown to assist in the substitution process. In general, as shown in FIG. 3, the metal substitution results in a conversion of the electrode structures 10 into structures comprising substantially of the substituted metal. In the present embodiment, the structures 10 are comprised of substantially W. As shown in FIG. 4, the oxide regions 28 and 30 are removed by wet etching to expose the metal electrode structures to further processing.

Figure 5:
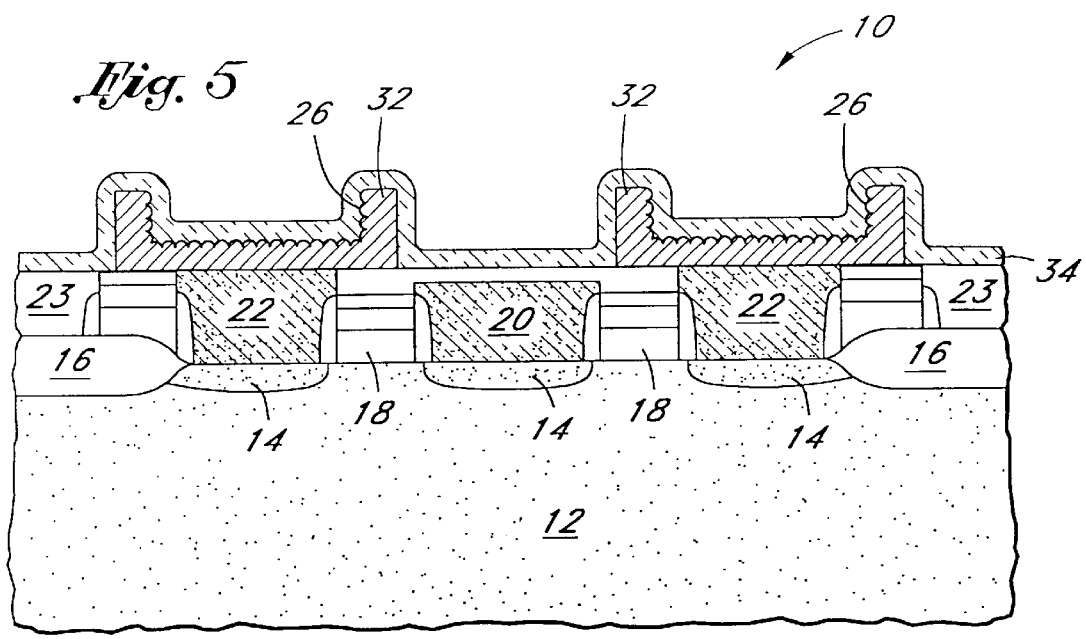
FIG. 5 is a schematic section of a preferred DRAM electrode with a deposited dielectric layer.
Figure 6:
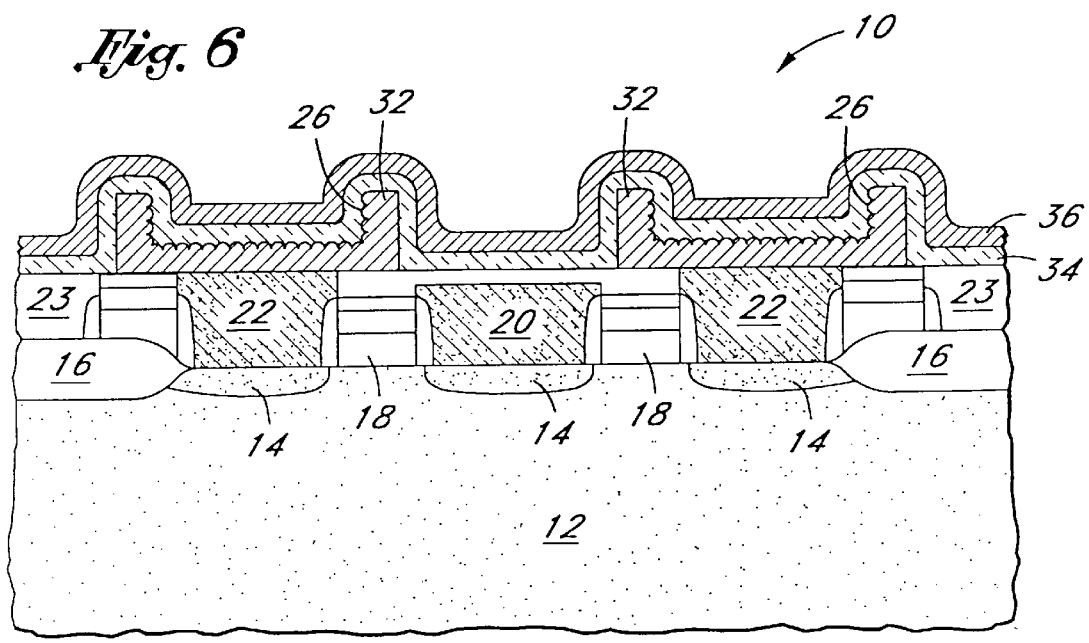
FIG. 6 is a schematic section of a completed DRAM structure in accordance with the present invention.

An appropriate dielectric layer 34 is then deposited conformally over the metal electrode structures 10 as shown in FIG. 5. Preferred dielectric layers comprise materials having high dielectric constant $\epsilon$, such as $Ta_2O_5$, $BaTiO_3$, $SrTiO_3$, $Ba_xSr_{1-x}TiO_3$ or $PbZr_xTi_{1-x}O_3$. Such materials may be deposited by chemical vapor deposition processes, as is well-known in the art. The capacitor structure is completed by deposition of a reference electrode layer 36, preferably also by a CVD process. The reference electrode 36 should minimally comprise a material having high conductivity, and which is also chemically compatible with the dielectric layer 34. CVD titanium or TiN may for example serve as reference electrodes as they are compatible with titanate-based dielectrics.

Figure 7:
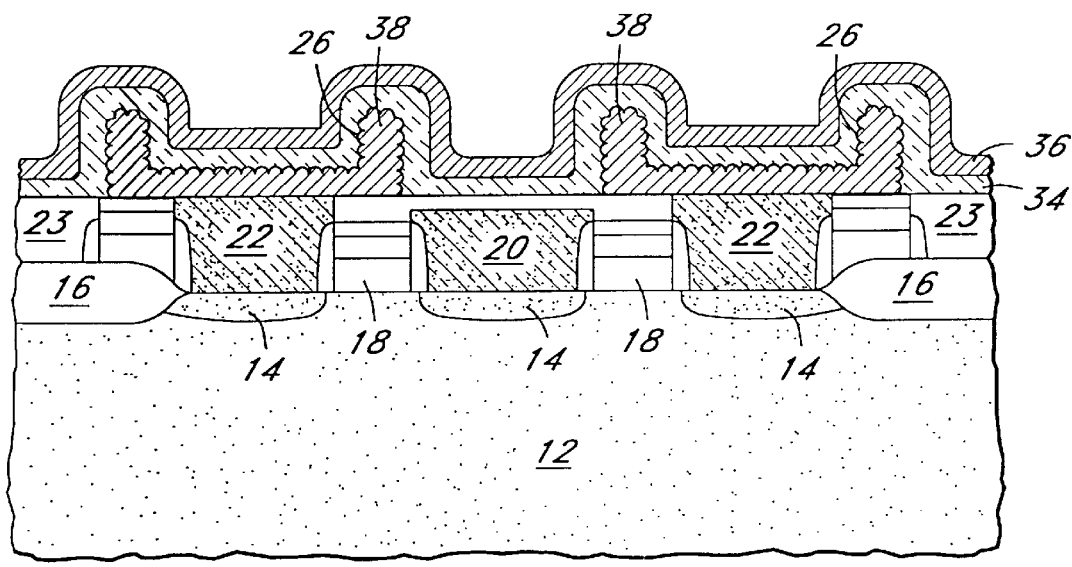
FIG. 7 is a schematic section of an alternative embodiment of a completed DRAM structure in accordance with the present invention.

As shown in FIG. 7, alternative embodiments of the complex, rugged metal electrodes may comprise textured surfaces 26 extending over the outer portions of the metal electrodes 38, thereby providing even greater capacitance. Clearly the principle of forming rugged metal electrodes may be extended to a variety of capacitor arrangements where good conductivity and high capacitance are requisite in small geometries.

Although described above with reference to the preferred embodiments, modifications within the scope of the invention may be apparent to those skilled in the art, all such modifications are intended to be within the scope of the appended claims.

What is claimed is:

1. A method of forming a rugged metal structure comprising the steps of:
    forming a rugged structure comprised of substantially silicon atoms; and
    replacing silicon atoms in the rugged structure with metal atoms, wherein replacing comprises exposing the structure to a metal-halide.

2. The method of claim 1, wherein the step of forming a rugged structure comprises:
    depositing an amorphous or polycrystalline silicon structure by chemical vapor deposition; and
    annealing the silicon structure to form a silicon surface having a rugged surface morphology.

3. The method of claim 1, wherein the step of replacing silicon atoms with metal atoms comprises exposing the rugged structure to a refractory metal-halide complex.

4. The method of claim 3, wherein the refractory metal-halide complex comprises $WF_6$.

5. The method of claim 4, further comprising the step of chemically oxidizing the rugged structure prior to exposing the rugged structure to the refractory metal-halide complex.

6. A process for fabricating a metal-insulator-metal capacitor on a semiconductor wafer comprising the steps of:
    forming a silicon electrode structure on the semiconductor wafer;
    making the silicon electrode structure rugged; and
    replacing the silicon in the silicon electrode structure with a metal, by exposing the silicon electrode structure to a metal-halide complex, thereby forming a rugged metal electrode.

7. The process of claim 6, further comprising covering the rugged metal electrode with a dielectric layer having a high dielectric constant.

8. The process of claim 7, further comprising covering the dielectric layer with a metal layer.

9. The process of claim 6, wherein the step of replacing the silicon in the silicon electrode structure comprises exposing the silicon electrode structure to a refractory metal-halide complex.

10. The process of claim 9, wherein the refractory metal-halide complex comprises $WF_6$.

11. The process of claim 7, wherein the dielectric layer comprises a material selected from the group consisting of $Ta_2O_5$, $BaTiO_3$, $SrTiO_3$, $Ba_xSr_{1-x}TiO_3$, and $PbZr_xTi_{1-x}O_3$.

12. The process of claim 8, wherein the metal layer comprises titanium.

13. A method of forming an integrated circuit capacitor comprising:
    forming a metal electrode having a rugged surface, by exposing a silicon structure to a metal halide complex;
    covering said rugged surface with a dielectric; and
    covering said dielectric with a second electrode.

14. The method of claim 1, wherein the rugged structure of substantially silicon atoms comprises a hemispherically grained silicon structure.

15. The process of claim 6, wherein making the silicon electrode structure rugged comprises seeding and annealing to form a hemispherically grained silicon layer.

16. The method of claim 13, wherein forming the metal electrode comprises providing a hemispherical grain silicon morphology.

17. The method of claim 13, wherein forming the metal electrode comprises forming a rugged silicon layer and converting the silicon layer to metal.

* * * * *